(12) United States Patent
Kimura

(10) Patent No.: US 7,619,425 B2
(45) Date of Patent: Nov. 17, 2009

(54) ELECTRICAL CONNECTING APPARATUS

(75) Inventor: Ken Kimura, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 345 days.

(21) Appl. No.: 11/814,945

(22) PCT Filed: Feb. 8, 2005

(86) PCT No.: PCT/JP2005/002193

§ 371 (c)(1),
(2), (4) Date: Jul. 27, 2007

(87) PCT Pub. No.: WO2006/085388

PCT Pub. Date: Aug. 17, 2006

(65) Prior Publication Data

US 2009/0021274 A1    Jan. 22, 2009

(51) Int. Cl.
*G01R 31/02* (2006.01)

(52) U.S. Cl. ..................................... 324/754

(58) Field of Classification Search ............... 324/158.1, 324/750–755; 439/482, 901; 361/474, 752
See application file for complete search history.

(56) References Cited

U.S. PATENT DOCUMENTS 5,986,459 A * 11/1999 Fukaya et al. ............... 324/755
6,323,663 B1 * 11/2001 Nakata et al. ............... 324/754

FOREIGN PATENT DOCUMENTS

JP    05-174880    7/1993
JP    2002-246128    8/2002

* cited by examiner

*Primary Examiner*—Ha Tran T Nguyen
*Assistant Examiner*—Trung Q Nguyen
(74) *Attorney, Agent, or Firm*—Ingrassia Fisher & Lorenz, P.C.

(57) ABSTRACT

An electrical connecting apparatus comprises a plurality of plate-shaped probes. Each probe has a cut-off portion opening on its inside surface side and both sides in the thickness direction of the probe and is engaged with a dropout preventing member disposed in a plate-shaped housing at the cut-off portion, thereby being prevented from dropping out of the housing.

10 Claims, 6 Drawing Sheets

ELECTRICAL CONNECTING APPARATUS

TECHNICAL FIELD

The present invention relates to an electrical connecting apparatus for use in an electrical test of a flat plate-shaped device under test such as an integrated circuit, and more particularly, to an apparatus for electrically connecting an electrode of the device under test to an electric circuit of a tester.

BACKGROUND

A packaged semiconductor device has a plurality of leads or electrodes projected from a package body. This sort of semiconductor device is subjected to an electrical test by using an electrical connecting apparatus called socket. There are such electrical connecting apparatus as described in Patent Documents 1 and 2.

Patent Document 1: Japanese Patent Appln. Public Disclosure No. 11-31566
Patent Document 2: Japanese Patent Appln. Public Disclosure No. 2003-297506

The electric connecting apparatus described in Patent Documents 1 and 2 comprise: a plurality of probes having a curved portion; a housing with the probes arranged in parallel; and rod-like needle retainers or elastic members disposed in the housing so as to extend in the arrangement direction of the probes.

The housing is mounted on a base plate such as a wiring board with a plurality of screw members. The probes are pressed at the outside surface of the curved portion against an conductive portion of the base plate by the needle retainers.

A device under test, when its electrodes are pressed by the front ends (tips) of the probes, is electrically connected to the electrodes of the base plate by the probes.

In the foregoing electrical connecting apparatus, however, since the outside surface of the curved portion of the probe is only brought into contact with the conductive portion of the base plate in a state that the housing is attached to the base plate, the probes tend to drop off in a state before the housing is attached to the base plate; therefore, assembling is troublesome.

In the electrical connecting apparatus described in Patent Document 2, if the elastic member is close-fitted into the probe, attitudes of adjoining probes in a state of being attached to the elastic member do not coincide, and an accurate electrical test cannot be conducted.

BRIEF SUMMARY

Problem to be Solved

An object of the present invention is to prevent the probes from dropping off the housing even though height positions of the tips are aligned.

Means to Solve Problem

The electrical connecting apparatus according to the present invention comprises: a plate-shaped housing with a plurality of slots penetrating the housing in its thickness direction and extending in a second direction intersecting a first direction orthogonal to the thickness direction at a distance in the first direction; a plurality of plate-shaped probes each of which has a front end to be pressed against an electrode of a device under test, an outside surface placed at one end edge widthwise of the probe and extending in an arc-like shape backward from the front end, and an inside surface opposite to the outside surface, the probes being arranged in the slots such that the front ends project on one side in the thickness direction of the housing; and needle retainers disposed in the housing so as to contact the inside surface and extend in the first direction.

The housing further has a groove-shaped first recess extending in the first direction through a partition wall dividing adjoining slots and opening on the other side in the thickness direction. Each probe further has a cut-off portion opening on the inside surface side and both sides in the thickness direction of the probe. The electrical connecting apparatus further comprises a dropout preventing member disposed in the cut-off portion and the first recess so as to extend in the first direction.

Effect of the Embodiments of the Invention

In the electrical connecting apparatus of the present invention, the dropout preventing member is supported in the housing in a state before the housing is assembled into another member such as a base plate, and the probes, engaged with the dropout preventing member which is passed through the cut-off portion opening on both sides in the thickness direction, are prevented from dropping off the housing and the dropout preventing member.

Thus, according to the electrical connecting apparatus of the present invention, it suffices just to engage the probes with the dropout preventing member so as to receive the dropout preventing member in the cut-off portion, and also, the assembling work of the electrical connecting apparatus is facilitated.

Also, in the electrical connecting apparatus of the present invention, in a state where the housing is assembled into another member, the probes are pressed against the conductive portion of another member by the needle retainer. Thus, the probes are engaged with the dropout preventing member in the cut-off portion, and also the height positions of the tips coincide, thereby enabling to conduct an accurate electrical test.

Each end portion of the dropout preventing member may be closely fitted into the end portion of the first recess. By doing so, the dropout preventing member is prevented from dropping out of the housing before mounting the housing on another member, thereby facilitating the assembling work.

The central region in the longitudinal direction of the dropout preventing member may be positioned in the central region of the first recess, and may engage the probes in the central region of the dropout preventing member.

The housing may further have a groove-shaped second recess extending in the first direction through the tail end side position of the slot at a distance from the first recess to the tail end side in the second direction and opening on the other side in the thickness direction, and each probe may further have a tail end positioned in the second recess, and the needle retainer may be disposed in the second recess.

Each end portion of the needle retainer may be close-fitted into the end portion of the second recess. By doing so, the needle retainer is prevented from dropping out of the housing before the housing is mounted on another member, thereby facilitating the assembling work.

The tail end may be in contact with a wall surface forming the second recess. By doing so, when the front end is pressed against the device under test, the probe elastically deforms the needle retainer by its tail end portion, so that the pressing position against the conductive portion gets out of the position, and the probe applies a scraping action to the conductive portion.

The dropout preventing member and needle retainer may be made of a rubber material such as silicon rubber.

The outside surface of each probe may be positioned on the other side in the thickness direction of the housing.

The electrical connecting apparatus can further comprise a base plate on which the housing is mounted and which has a plurality of conductive portions with which the probe is brought into contact at a part of the outside surface of the probe.

The electrical connecting apparatus may further comprise a plate-shaped frame laid over the housing and having a third recess penetrating in the thickness direction so as to receive a device under test, and communicated to the slot, and each probe may project its front end into the third recess.

Figure 1:
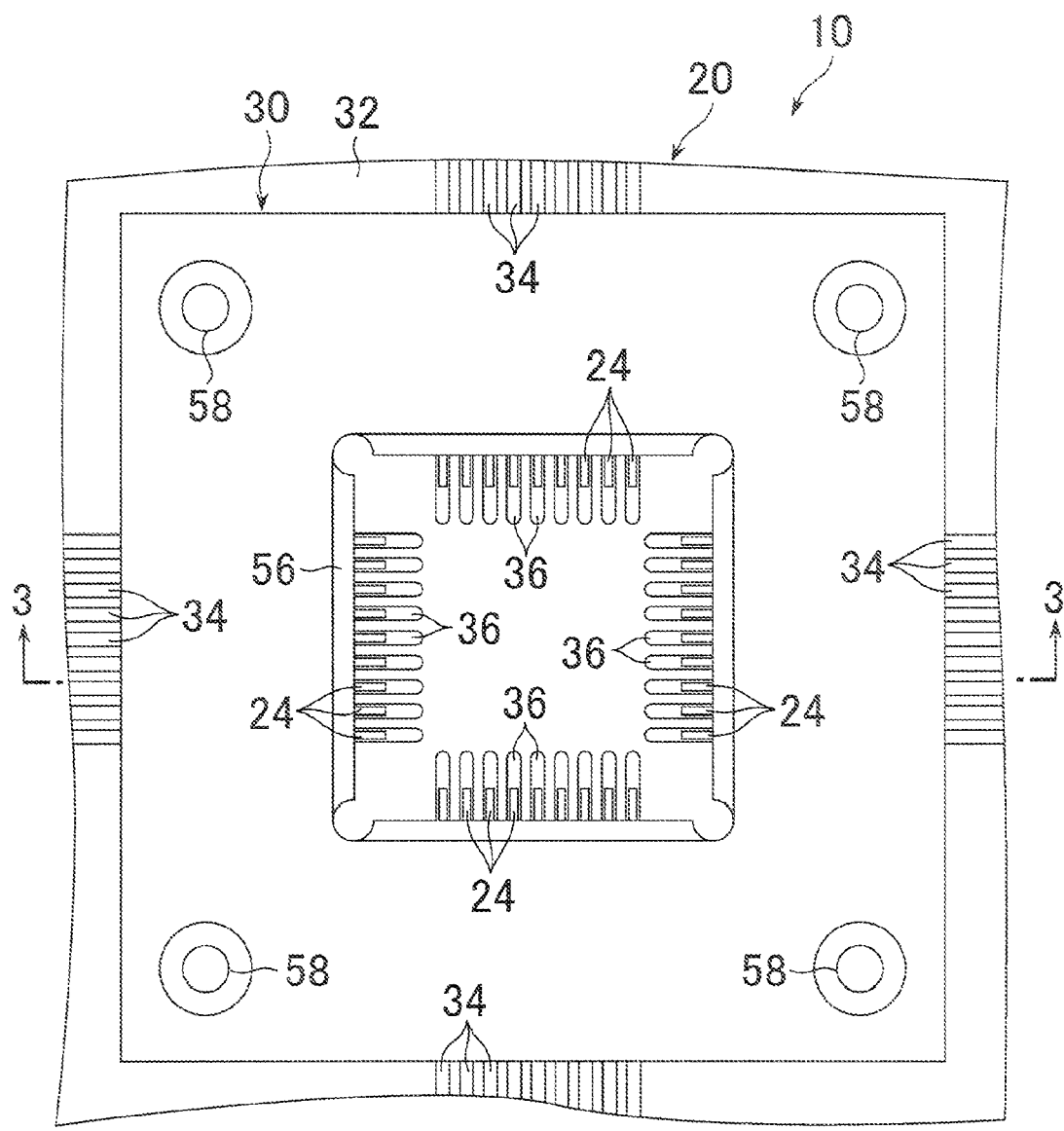
FIG. 1 is a plan view showing a first embodiment of the electrical connecting apparatus according to the present invention.

EXPLANATION OF REFERENCE NUMERALS 10 electrical connecting apparatus
12 device under test
14 main body of device under test
16 electrode of device under test
20 base plate
22 housing
24 probe
26 needle retainer
28 dropout preventing member
30 frame
32 plate material of base plate
34 conductive portion of base plate
36 slot of housing
38, 40 groove of housing
42 partition wall for slot
44 front end of probe
46 outside surface of probe
48 inside surface of probe
50 cut-off portion of probe
52 tail end of probe
54 wall surface of groove
56 recess of frame
58 screw member

DETAILED DESCRIPTION

In the following description, the thickness direction of the plate-shaped housing to be mentioned later is called a vertical direction, the front end (tip) side to be pressed against the electrode of a device under test relative to the mounting region is called a front end side; and the opposite side to the front end is called the tail end side. In actual use of the probe assembly, however, the thickness direction of the housing may be made a diagonal or a lateral direction, or the vertical direction may be inverted.

Figure 2:
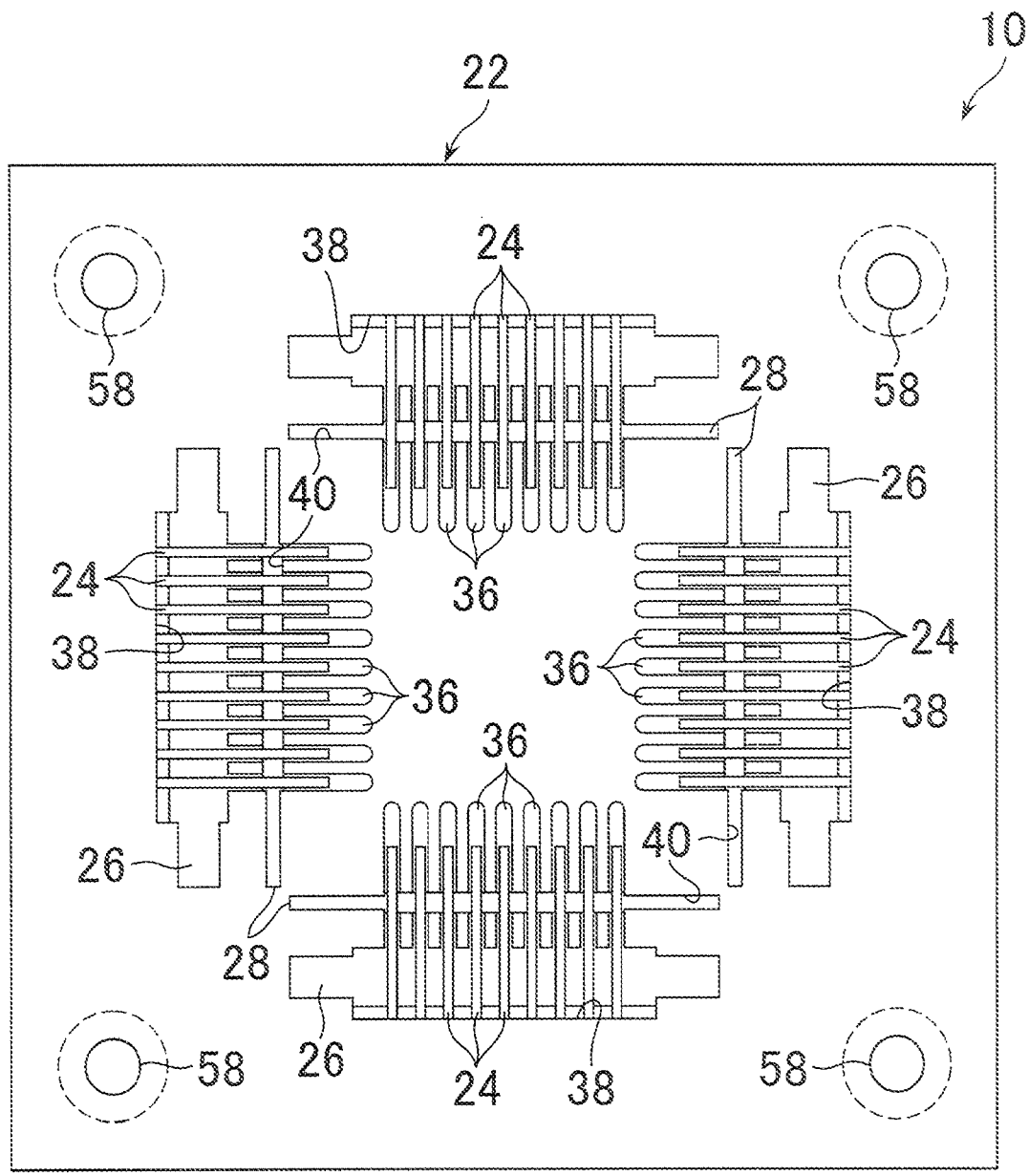
FIG. 2 is a bottom view of the electrical connecting apparatus shown in FIG. 1 with the base plate removed.
Figure 3:
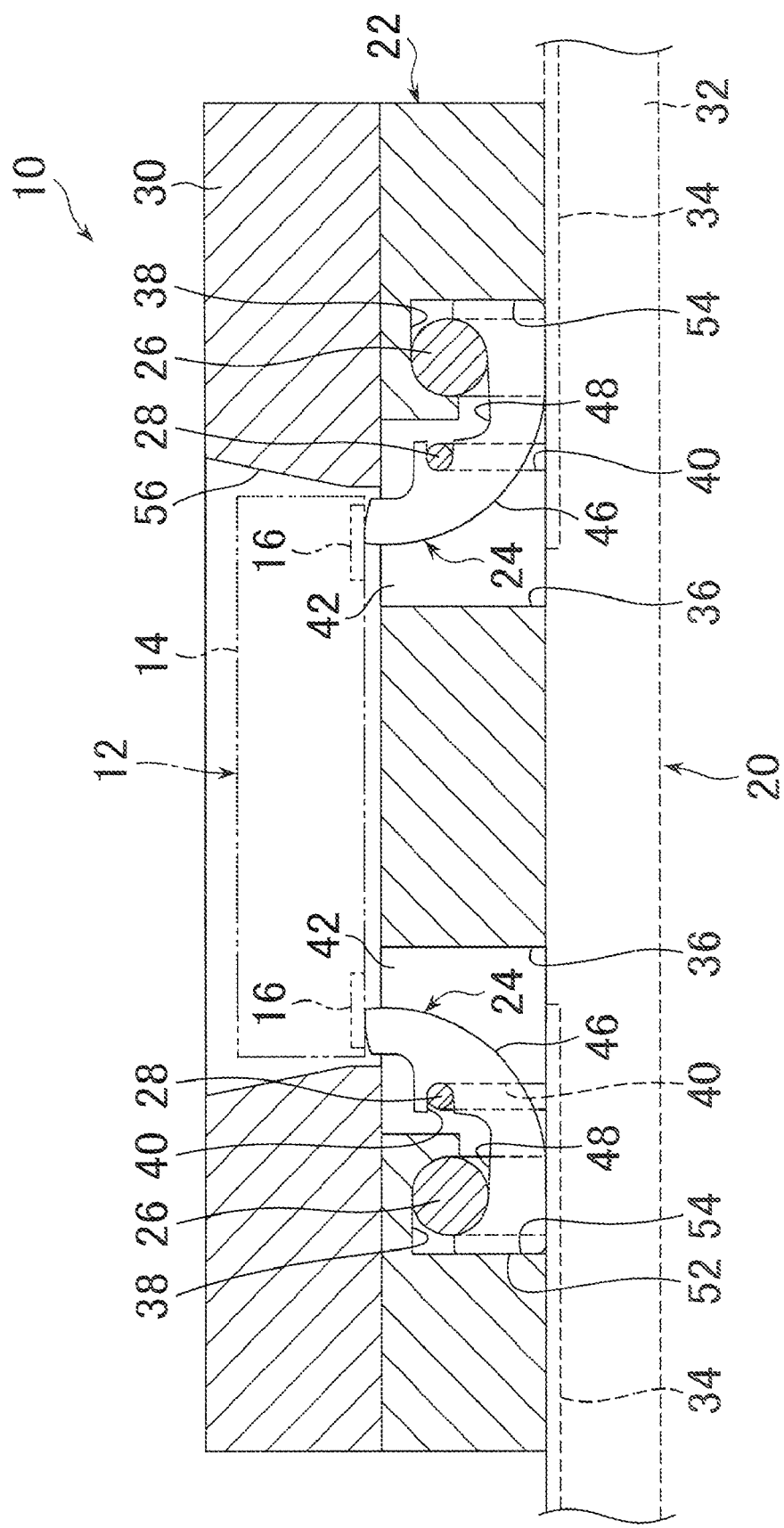
FIG. 3 is a section obtained along line 3-3 in FIG. 1.

Referring to FIGS. 1-7, the electrical connecting apparatus 10 is used as an auxiliary apparatus for testing the flat plate-shaped device under test 12 shown in FIG. 3. The device under test 12 in the illustration is a semiconductor device such as a packaged or molded integrated circuit, but the present invention can be also applied to an electrical connecting apparatus for testing another flat plate-shaped device under test such as a liquid crystal display panel.

The device under test 12 has a body 14 packaged or molded in a rectangular plane configuration, and a plurality of electrodes 16 provided at positions corresponding to each side of the rectangle. Those electrodes 16 are divided into a plurality of electrode groups which correspond to respective sides of the body 14 and are arranged in each group in parallel at intervals in the longitudinal direction of the corresponding side.

The connecting apparatus 10 comprises: a base plate 20 such as a wiring board; a plate-shaped cover, i.e., housing 22 laid over the base plate 20; a plurality of plate-shaped contacts, i.e., probes 24 arranged in the housing in correspondence to the electrodes 16 individually; a plurality of long needle retainers 26 arranged in the housing 22 so as to press the probes 24 against the base plate 20; a plurality of long dropout preventing members 28 arranged in the housing 22 so as to prevent the probes 24 from dropping out; and a plate-shaped frame 30 laid over the housing 22.

The base plate 20 is a wiring board with a wiring pattern formed on one surface of a plate material 32 made of an electrical insulating material by printed wiring technique, each having a plurality of strip-like wirings, i.e., conductive portions 34 respectively in correspondence to the probes 24 on one surface (upside).

Each conductive portion 34 is a part of the wiring pattern. Those conductive portions 34 are divided into plural conductive groups individually corresponding to the sides of the rectangle of the body 14 of the device under test 12 and extend in a direction (second or first direction) orthogonal to the longitudinal direction of the corresponding side at intervals in the longitudinal direction (first or second direction) of the side corresponding each conductive portion group in the neighborhood of the probes 24.

The housing 22 includes a plurality of slots 36 penetrating in its thickness direction and respectively opposing each corresponding conductive portion 34. Each slot 36 is for accommodating at least the front end portion and central portion of the probe 24, and the number of the slots provided is the same as that of the probes 24.

Those slots 36 are divided into a plurality of slot groups individually corresponding to the sides of the rectangle of the body 14 of the device under test 12. The positions of the slots 36 in the longitudinal direction of the corresponding sides coincide with each slot group.

The conductive portions of each group are formed in parallel at intervals in a longitudinal direction (first or second direction) of the corresponding side, and extend in a direction orthogonal to the longitudinal direction of the corresponding side.

The housing 22 also has four sets of grooves 38, 40 communicating to the slots 36 and opening downward. Each set of the grooves 38, 40 is a groove group individually corresponding to each side of the rectangle of the body 14 of the device under test 12.

The grooves 38 of each groove group extend in the longitudinal direction (first or second direction) of the corresponding side through partition walls 42 which divide the slots 36.

The grooves 40 of each groove group extend in the longitudinal direction (first or second direction) of the corresponding side at intervals on the central side in the longitudinal direction of the slots 36 from the corresponding grooves 38.

The width dimension of each end portion of the grooves 38 and 40 is smaller than the width dimension of each end portion at the position of each partition wall 42 forming the slot 36.

Such a housing 22 can be made of a non-conductive material such as a synthetic resin.

Each probe 24 is a blade type probe shaped like a plate made of a conductive metal material, and arranged in the housing 22 such that its width direction becomes the vertical direction (thickness direction of the housing 22).

Each probe 24 has, as shown in FIGS. 4-7: a front end 44 formed on one end (front end) side so as to be pressed against the electrode 16 of the device under test 12, an outside surface 46 existing on one side in the width direction and curved in an arc-like shape extending rearward from the front end 44; an inside surface 48 opposing the outside surface 46; a recess, i.e., a cut-off portion 50 opening on the side of the inside surface 48; and a tail end 52 extending in the vertical direction.

The front end 44 of each probe 24 is curved like an arc so as to serve as a needle point and has a smaller width dimension than the tail end 52. The outside surface 46 is formed in the central region ranging from the tail end portion of the probe 24 to the neighborhood of the front end 44. The cut-off portion 50 is formed at a position closer to the front end side than to the inside surface 48 of the probe 24.

The tail end 52 of each probe 24 is linear. However, the upper and lower corner angle portions of the tail end 52 of each probe 24 are made an arc-like surface of a small radius of curvature Those probes 24 are divided into plural probe groups respectively corresponding to the sides of the rectangle of the body 14 of the device under test 12, and placed at intervals in the longitudinal direction (first or second direction) of the corresponding side.

In the illustration, since the device under test has a plurality of electrodes 16 on each of the four sides of the rectangle, the probes 24 are divided into four probe groups. For the same reason, in the illustration, four dropout preventing member 28 and four needle retainers 26 are provided.

Each probe 24 is arranged in the housing 22 such that the tail end portion is located in the groove 38, that the central portion is located in the slot 36, that the front end portion is projected upward from the slot 36, and that the cut-off portion 50 is opposed to the groove 40. The tail end 52 is brought into contact with the outside surface 54 defining the groove 38.

The needle retainer 26 and the dropout preventing member 28 are respectively made of an elastically deformable electrical insulating rubber material such as a silicon rubber to be a square timber-like shape or a round bar-like shape. The needle retainer 26 and the dropout preventing member 28, however, may have another shapes and may be hollow, in particular.

Each end portion of the needle retainer 26 is, as shown in FIG. 2, close-fitted into the end portion of the groove 38. By this, the needle retainer 26 is prevented from dropping out of the housing 22.

Each central region of the needle retainer 26 is fitted into the position of the groove 38 of the partition wall 42 and brought into contact with the tail end portion of the inside surface 48 of the probe 24, and besides, presses the probe 24 against the conductive portion 34.

Each end portion of the dropout preventing member 28 is, as shown in FIG. 2, close-fitted into an end portion of the groove 40. Thus, the dropout preventing member 28 is prevented from dropping out of the housing 22.

The central region of the dropout preventing member 28 is fitted into the position of the groove 40 of the partition wall 42 and engages the probe 24.

The conductive portion groups, slot groups and probe groups correspond to the electrode groups of the device under test 12. Therefore, each set of the conductive portions 34, slots 36 and probes 24 is made to correspond to the electrodes of the device under test 12.

The frame 30 has an opening, i.e., a recess 56 penetrating in its thickness direction (vertical direction). The recess 56 has a rectangular plane configuration which is similar to the body 14 of the device under test 12. The upper part of the recess 56 is an inclined surface directed from the outside toward the central side, whose area becomes smaller toward the lower side.

The housing 22 is laid over the base plate such that the probes 24, the needle retainers 26 and the dropout preventing members 28 are arranged as mentioned above, that the outside surface 46 of each probe 24 contacts the conductive portion 34 and that the grooves 38 and 40 open on the side of the base plate 20.

The frame 30 is laid over the housing 22 such that the inclined surface of the recess 56 is directed upward and that the front end 44 of each probe 24 is located within the recess 56.

The housing 22 and the frame 30 are assembled into the electrical connecting apparatus 10, in a state of being arranged as mentioned above, by a plurality of screw members 58 penetrating the frame 30 and the housing 22 and screwed into the screw holes of the base plate 20.

The electrical connecting apparatus 10 can be assembled as follows.

Figure 6:
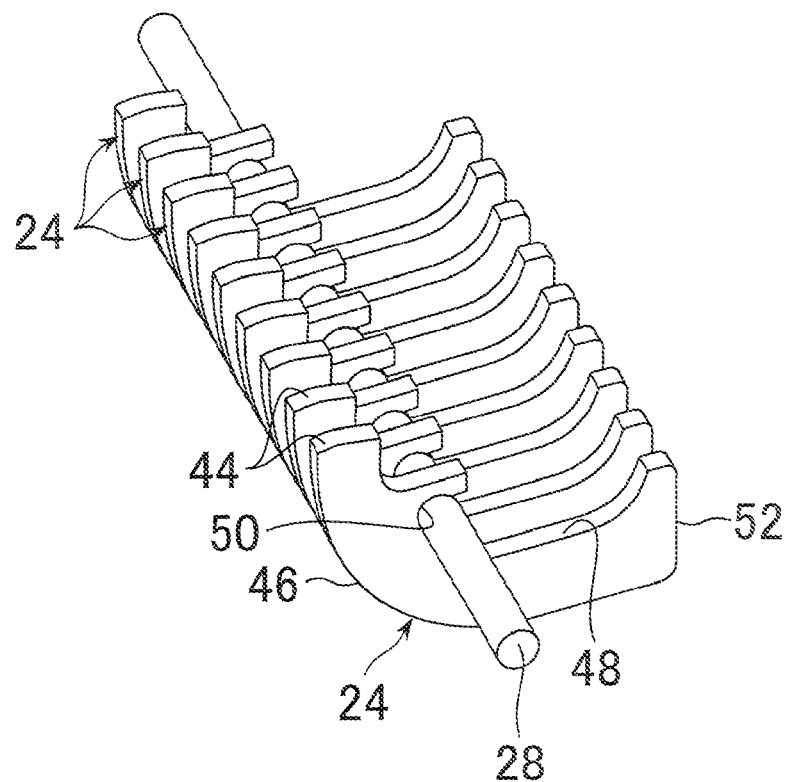
FIG. 6 is a perspective view partly showing an assembled state of the probe and the dropout preventing member.
Figure 7:
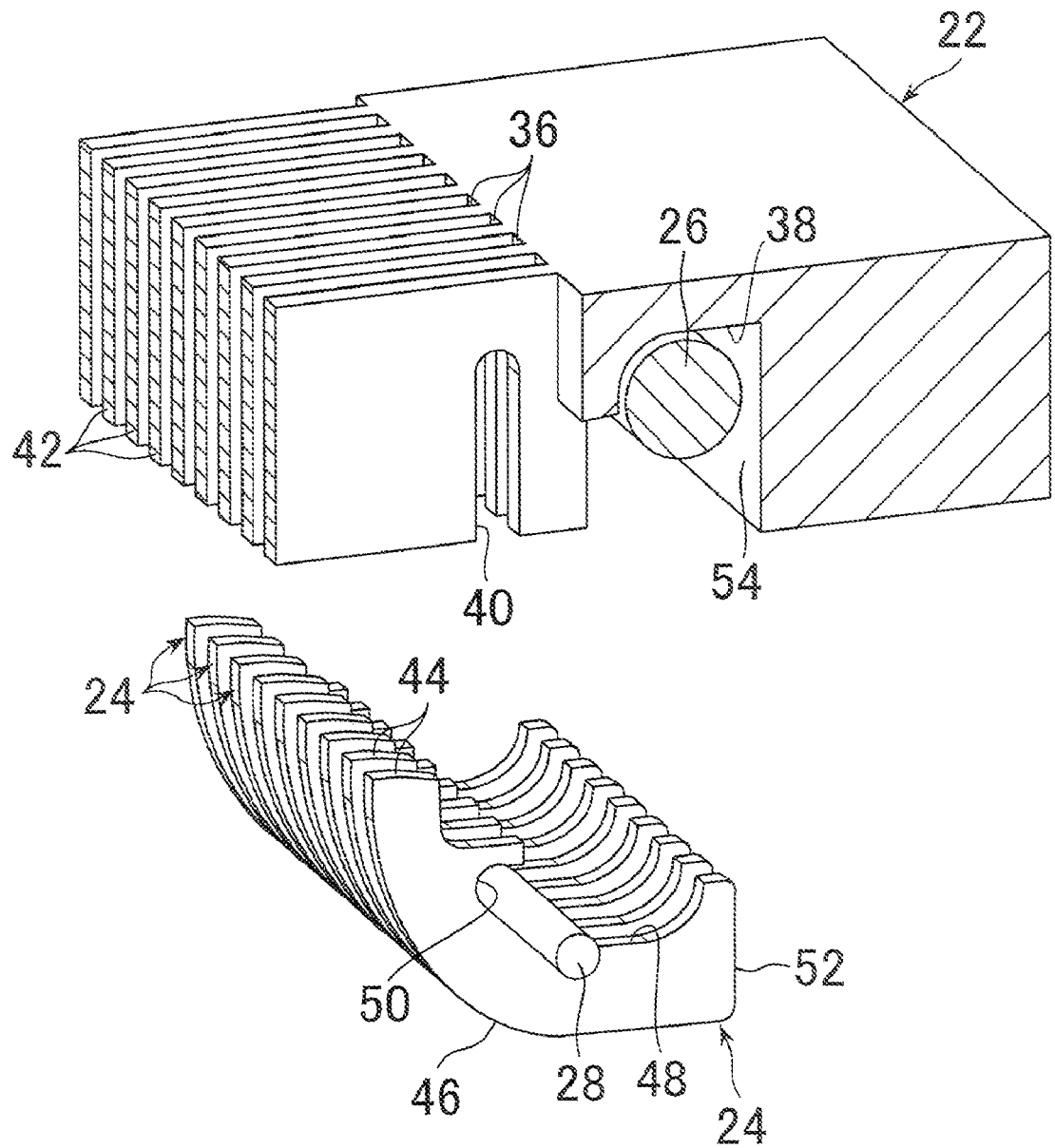
FIG. 7 is a sectional perspective view partly showing an assembly of the probes and the dropout preventing member and an assembly of the housing and the needle retainer in a dismantled state.

First, the dropout preventing member 28 is fitted into the cut-off portion 50 of each probe 24 of the corresponding probe group, thereby producing the four probe assemblies as shown in FIGS. 6 and 7.

Concurrently with the foregoing, each needle retainer 26 is arranged in the groove 38 of the housing 22. Each needle retainer 26 is prevented from dropping out of the housing 22 as each end portion is close-fitted into the end portion of the groove 38.

Figure 5:
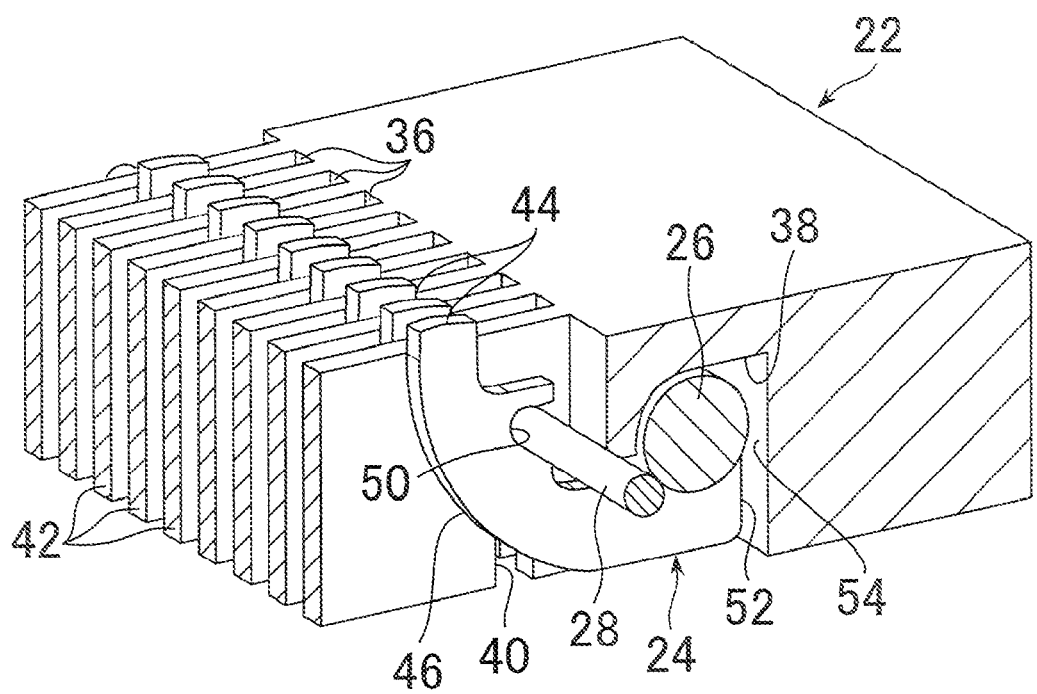
FIG. 5 is a sectional perspective view partly showing a physical relationship of the probe, needle retainer and dropout preventing member to the housing.

Next, the probe assembly is disposed in the housing 22 such that each probe 24 of each probe group is passed from the side of the corresponding groove 38 into the corresponding slot 36, that the tail end 52 of each probe 24 is brought into contact with the wall surface 54 of the groove 38, that the front end 44 of each probe 26 is projected into the recess 56, and that the cut-off portion 50 surfaces the groove 40 (See FIGS. 5 and 7).

The dropout preventing member 28 is close-fitted into the end portion of the groove 40. Thereby, the probe 24 is disposed in the housing so as not to drop out. At this time, the probe 24 is engaged with the dropout preventing member 28, thereby facilitating the arrangement of the probe assembly in the housing.

When disposing the probe assembly in the housing 22 as mentioned above, it is desirable that the up and down relationship between the probe assembly and the housing in the state shown in FIGS. 5 and 7 be reversed. This facilitates disposing work of the probe assembly in the housing 22.

Then, the frame 30 is disposed on the housing 22.

Then, the housing 22 and the frame 30 are, in a state of being arranged as in the foregoing, laid over the base plate 20 to be mounted on the base plate 20 by the screw member 48.

When decomposing the assembled connecting apparatus 10, an operation reverse thereto is performed.

In such an assembled state, the probe 24 is pressed against the conductive portion 34 of the base plate 20 at a part of the outside surface 46 by the needle retainer 26, sandwiched between the base plate 20 and the needle retainer 26 and maintained as it is. Thus, the probe 24 is more surely prevented from dropping out of the housing 22 to surely electrically connect the probe 24 and the conductive portion 32.

In the illustration, the needle retainer 26, dropout preventing member 28, housing 22 and screw member 58 serve as an assembling apparatus for assembling the probes 24 into the base plate 20.

It is not necessary to close-fit the dropout preventing member 28 into the cut-off portion 50 of the probe 24. By doing so, the probe 24 is engaged with the dropout preventing member 28 in the cut-off portion 50 to be prevented from dropping out, but displaces relative to the dropout preventing member 28 by being pressed against the conductive portion 34 in a state of being assembled into the electrical connecting apparatus 10. Thereby, the attitudes and height positions of adjoining probes 24 coincide.

However, the dropout preventing member 28 may be close-fitted into the cut-off portion 50. By doing so, the probe 24 can be surely prevented from dropping out of the dropout preventing member 28.

When testing, the device under test 12 is put into the recess 58 from above. At this time, if the position of the device under test 12 relative to the connecting apparatus 10 is deviated, the device under test 12 is brought into contact with the inclined surface of the recess 56 and guided to the center of the recess 56 by the inclined surface. By this, the device under test 12 is received in the connecting apparatus 10 with the electrode 16 brought into contact with the front end 46 of the probe 24.

Figure 4:
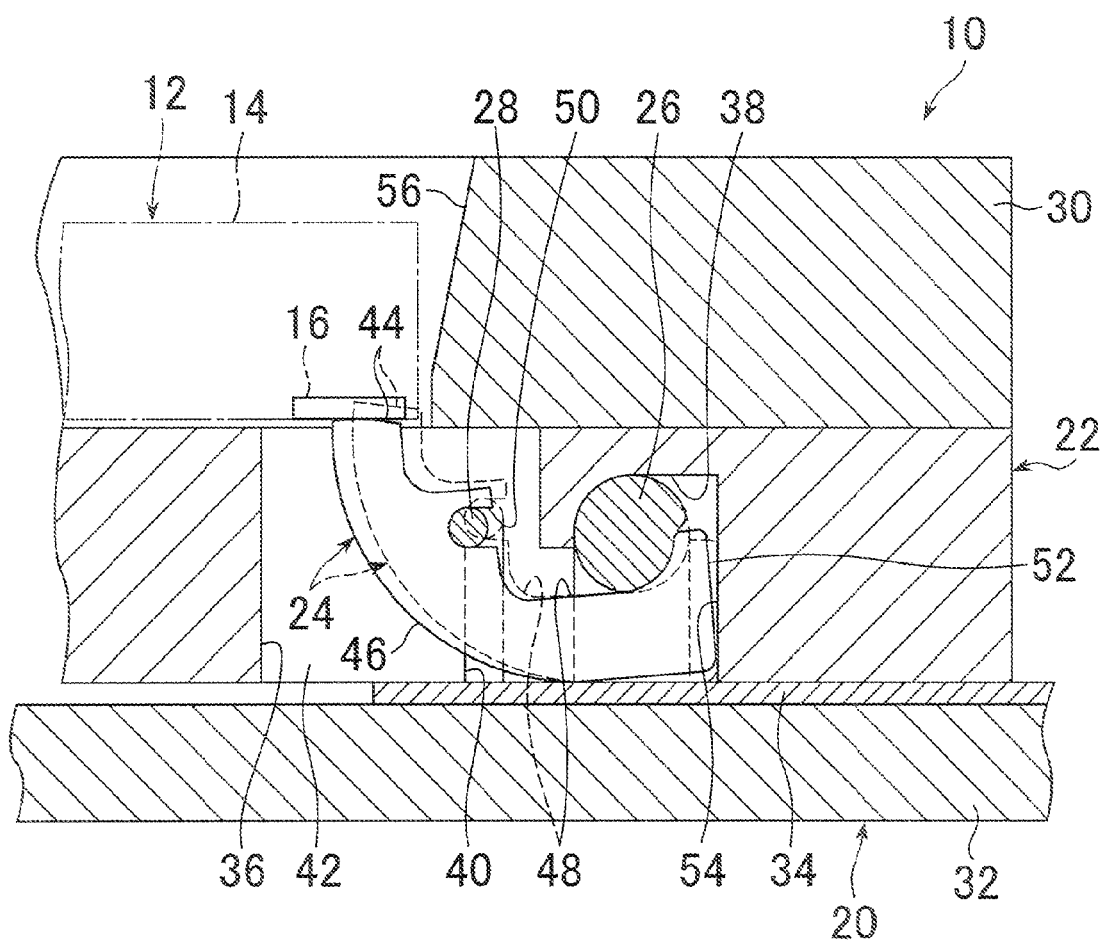
FIG. 4 is a section with a part in FIG. 3 enlarged.

When the device under test 12 disposed in the connecting apparatus 10 is pressed down by a presser (not shown), each probe 24, receiving an overdrive action and elastically deforming the needle retainer 26, is deformed into the state as shown by a solid line from the state as shown by a dotted line in FIG. 4. At this time, a force to make the probe 24 move backward acts on the probe 24.

However, since the tail end 52 of each probe 24 is directly in contact with the surface 54 of the groove 38, each probe 24, displacing with its tail end lower part as a fulcrum into the state shown by the solid line in FIG. 4, elastically deforms the needle retainer 26.

By this, the front end 44 of each probe 24 is displaced in the longitudinal direction of the probe 24 relative to the electrode 16, and also the contact portion of the probe 24 with the conductive portion 34 is changed to the side of the front end 44, thereby resulting in a rubbing action (or scraping action) to remove a part of an oxide film existing on the surface of the electrode 16.

However, when the device under test 12 is pressed down by the above-mentioned presser, each probe 24 is pressed against the conductive portion 34, so that each probe 24 may be made not to be pressed against the conductive portion 34 by the needle retainer 26 in a state of being assembled into the electrical connecting apparatus or in a state that the device under test 12 is not pressed down by the presser.

In the connecting apparatus 10, the dropout preventing member 28 is supported on the housing 22 before the housing 22 is assembled into the base plate 20, and the probe 24 is engaged with the dropout preventing member 28 which is passed through the cut-off portion 50, thereby preventing the probe 24 from dropping out of the housing 22 and the dropout preventive member 28. Thus, according to the electrical connecting apparatus 10, it suffices to engage the probe 24 with the dropout preventive member 28 so as to have the dropout preventive member 28 received in the cut-off portion 50, thereby facilitating the assembling work of the electrical connecting apparatus 10.

Also, in the electrical connecting apparatus, with the housing 22 assembled on the base plate 20, the probe 24 is pressed against the conductive portion 34 of the base plate 20 by the needle retainer 26. Thus, the probe 24 is engaged with the dropout preventive member 28 in the cut-off portion 50, and the height positions of the tips coincide, thereby enabling to conduct an accurate electrical test.

According to the connecting apparatus, the shape of the probe 24 is simple, so that the probe is not only inexpensive but also the electrical effective length of the probe 24 is small and suitable for a high frequency test and, moreover, though the probe 24 is kept stable, production of the connecting apparatus 10 is easy.

Also, according to the connecting apparatus 10, when the device under test 12 is naturally and accurately disposed in the connecting apparatus 10, the electrode 16 of the device under test 12 is surely brought into contact with the front end 44 of the probe 24, and the probe 24 elastically deforms the needle retainer 26, so that rubbing action is effectively caused to the electrode 16.

According to the connecting apparatus 10, further, the structure of the needle retainer 26 is simple, and an electric short circuit between the probes 24 is surely prevented.

INDUSTRIAL APPLICABILITY

While the above embodiment is applied to an electrical test of a device under test 12 having four electrode groups, the present invention can be applied to an electrical test of a device under test having another number of electrode groups such as a device under test having one electrode group. In that case, the same numbers of the probe groups and the slot groups as the number of the electrode groups of the device under test are provided in the connecting apparatus.

The present invention is not limited to the above embodiments but can be variously modified without departing from its purport.

What is claimed is:

1. An electrical connecting apparatus for electrically connecting electrodes of a device under test to an electric circuit, comprising:

a plate-shaped housing having a plurality of slots penetrating said housing in its thickness direction and extending in a second direction which intersects a first direction at a distance in the first direction orthogonal to the thickness direction;

a plurality of plate-shaped probes, each of which has a front end to be pressed against said electrode, an outside surface located at one end edge widthwise of said probe and extending in arc-like state rearward from said front end, and an inside surface on the opposite side to said outside surface, said probe being arranged in said slot such that said front end projects from said slot to one side in the thickness direction of said housing; and a needle retainer disposed in said housing so as to contact said inside surface and extend in the first direction;

wherein said housing further has a groove-shaped first recess extending in the first direction through a partition wall dividing adjoining slots and opening at the other side in the thickness direction;

wherein each probe further has a cut-off portion opening on the inside surface side and both sides in the thickness direction of the probe; and wherein said electrical connecting apparatus further comprises a dropout preventing member disposed in said cut-off portion and said first recess so as to extend in the first direction.

2. An electrical connecting apparatus claimed in claim 1, wherein each end portion of said dropout preventing member is close-fitted at the end portion of said first recess.

3. The electrical connecting apparatus claimed in claim 2, wherein a central region in the longitudinal direction of said dropout preventing member is located in a central region of said first recess and engages said probe in said central region of said dropout preventing member.

4. The electrical connecting apparatus claimed in claim 1, wherein said housing further has a groove-shaped second recess extending in the first direction from said first recess at a distance from the tail end side in the second direction through the position on the tail end side of said slot and opening on the other side in the thickness direction;

wherein each probe further has the tail end located in said second recess; and wherein said needle retainer is disposed in said second recess.

5. The electrical connecting apparatus claimed in claim 4, wherein each end portion of said needle retainer is close-fitted into the end portion of said second recess.

6. The electrical connecting apparatus claimed in claim 4, wherein said tail end is brought into contact with a wall surface forming said second recess.

7. The electrical connecting apparatus claimed in claim 1, wherein said dropout preventing member and said needle retainer is made of rubber material.

8. The electrical connecting apparatus claimed in claim 1, wherein said outside surface of each probe is located on the other side in the thickness direction of said housing.

9. The electrical connecting apparatus claimed in claim 1, further comprising a base plate mounting said housing and having a plurality of conductive portions with a part of which said probes are brought into contact.

10. The electrical connecting apparatus claimed in claim 1, further comprising a plate-shaped frame laid over said housing and having a third recess penetrating said frame and communicating to said slot, wherein each probe projects its front end into said third recess.

* * * * *